(12) United States Patent
Abedifard

(10) Patent No.: US 6,366,524 B1
(45) Date of Patent: Apr. 2, 2002

(54) ADDRESS DECODING IN MULTIPLE-BANK MEMORY ARCHITECTURES

(75) Inventor: Ebrahim Abedifard, Sunnyvale, CA (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 09/628,197

(22) Filed: Jul. 28, 2000

(51) Int. Cl.[7] ................................................ G11C 8/00
(52) U.S. Cl. .......................... 365/230.06; 365/230.03; 365/230.08
(58) Field of Search ...................... 365/230.06, 230.03, 365/230.08, 185.11

(56) References Cited

U.S. PATENT DOCUMENTS

| | | |
|---|---|---|
| 5,041,886 A | 8/1991 | Lee |
| 5,202,823 A * | 4/1993 | Shimogawa et al. ... 365/230.06 |
| 5,295,115 A * | 3/1994 | Furuya et al. ......... 365/230.06 |
| 5,537,354 A | 7/1996 | Mochizuki et al. |
| 5,600,605 A | 2/1997 | Schaefer |
| 5,666,321 A | 9/1997 | Schaefer |
| 5,748,557 A * | 5/1998 | Kang .................... 365/230.08 |
| 5,751,039 A | 5/1998 | Kauffman et al. |
| 5,787,457 A | 7/1998 | Miller et al. |
| 5,936,903 A | 8/1999 | Jeng et al. |
| 5,950,219 A * | 9/1999 | Rao ....................... 365/230.03 |
| 5,995,438 A | 11/1999 | Jeng et al. |
| 6,026,465 A | 2/2000 | Mills et al. |
| 6,137,133 A | 10/2000 | Kauffman et al. |
| 6,141,247 A | 10/2000 | Roohparvar et al. |
| 6,166,993 A * | 12/2000 | Yamauchi .............. 365/230.03 |

OTHER PUBLICATIONS

Keeth, et al., "DRAM circuit design: a tutorial," IEEE Press, 2001, pp. 16–23, 142–153.
Micron Semiconductor Products, Inc., "2Mb, Smart 5 BIOS–Optimized Boot Block Flash Memory," *Flash Memory* www.micron.com, copyright 2000, Micron Technology, Inc., pp. 1–12.
Micron, "16 Mb: ×16 SDRAM" *Synchronous DRAM*, www.micron.com, copyright 1999 Micron Technology, Inc., pp. 1–51.

* cited by examiner

Primary Examiner—Huan Hoang
(74) Attorney, Agent, or Firm—Fogg Slifer Polglaze Leffert & Jay, P.A.

(57) ABSTRACT

Methods and apparatus for decoding an externally-applied address in a synchronous memory device are arranged to decode a first portion of the address during a setup time and to decode a second portion of the address following the setup time. The first portion of the address may be indicative of a bank address of a multiple-bank memory device. The second portion of the address may be indicative of row and column addresses within a bank of the multiple-bank memory device. Decoding of the first portion of the address is performed by an address input buffer stage having a decoder interposed between the input buffers and the address latches, such that the decoder generally replaces a delay stage of a typical input buffer stage. As such, the first portion of the address is decoded during a setup time. By decoding the first portion of the address during a setup time, it is available to direct the second portion of the address to a proper decoder substantially without delay.

40 Claims, 8 Drawing Sheets

| | | | |
|---|---|---|---|
| Vcc | 1* | 54 | Vss |
| DQ0 | 2 | 53 | DQ15 |
| VccQ | 3 | 52 | VssQ |
| DQ1 | 4 | 51 | DQ14 |
| DQ2 | 5 | 50 | DQ13 |
| VssQ | 6 | 49 | VccQ |
| DQ3 | 7 | 48 | DQ12 |
| DQ4 | 8 | 47 | DQ11 |
| VccQ | 9 | 46 | VssQ |
| DQ5 | 10 | 45 | DQ10 |
| DQ6 | 11 | 44 | DQ9 |
| VssQ | 12 | 43 | VccQ |
| DQ7 | 13 | 42 | DQ8 |
| Vcc | 14 | 41 | Vss |
| DQML | 15 | 40 | RP# |
| WE# | 16 | 39 | DQMH |
| CAS# | 17 | 38 | CLK |
| RAS# | 18 | 37 | CKE |
| CS# | 19 | 36 | VccP |
| BA0 | 20 | 35 | A11 |
| BA1 | 21 | 34 | A9 |
| A10 | 22 | 33 | A8 |
| A0 | 23 | 32 | A7 |
| A1 | 24 | 31 | A6 |
| A2 | 25 | 30 | A5 |
| A3 | 26 | 29 | A4 |
| Vcc | 27 | 28 | Vss |

*Fig. 6A*

ADDRESS DECODING IN MULTIPLE-BANK MEMORY ARCHITECTURES

TECHNICAL FIELD OF THE INVENTION

The present invention relates generally to semiconductor memory devices, and in particular, the present invention relates to decoding bank addresses during a setup time for row and column addresses in multiple-bank semiconductor memory devices.

BACKGROUND OF THE INVENTION

Memory devices are typically provided as internal storage areas in the computer. The term memory identifies data storage that comes in the form of integrated circuit chips. In general, memory devices contain an array of memory cells for storing data, and row and column decoder circuits coupled to the array of memory cells for accessing the array of memory cells in response to an external address.

There are several different types of memory. One type is RAM (random-access memory). This is typically used as main memory in a computer environment. RAM refers to read and write memory; that is, you can repeatedly write data into RAM and read data from RAM. This is in contrast to ROM (read-only memory), which generally only permits the user in routine operation to read data already stored on the ROM. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM generally cannot be written to in routine operation. An EEPROM (electrically erasable programmable read-only memory) is a special type of non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of EEPROM that can be erased and reprogrammed in blocks instead of one byte at a time. Many modern PCs have their BIOS stored on a flash memory chip so that it can easily be updated if necessary. Such a BIOS is sometimes called a flash BIOS. Flash memory is also popular in modems because it enables the modem manufacturer to support new protocols as they become standardized.

A typical Flash memory comprises a memory array that includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

A synchronous DRAM (SDRAM) is a type of DRAM that can run at much higher clock speeds than conventional DRAM memory. SDRAM synchronizes itself with a CPU's bus and is capable of running at 100 MHZ, about three times faster than conventional FPM (Fast Page Mode) RAM, and about twice as fast EDO (Extended Data Output) DRAM and BEDO (Burst Extended Data Output) DRAM. SDRAMs can be accessed quickly, but are volatile. Many computer systems are designed to operate using SDRAM, but would benefit from non-volatile memory.

In synchronous memory devices, address and control inputs are referenced to a system clock with the same setup and hold times to insure that the information is valid at the proper time and available for a sufficient amount of time. As memory architectures increase in size, more complex addressing schemes are required to better manage the addressable memory locations. One such addressing scheme is to divide the memory array into multiple memory banks, with one or more address bits, or address input signals, determining which memory bank to address, and the remaining address bits, or address input signals, determining the row(s) and column(s) within a memory bank. However, complex addressing schemes make coordinating the decoding of address input signals more difficult as decoding of certain address input signals may be required before others.

For the reasons stated above, and for other reasons stated below which will become apparent to those skilled in the art upon reading and understanding the present specification, there is a need in the art for alternate methods and circuits for decoding addresses in high-performance memory devices.

SUMMARY OF THE INVENTION

The above-mentioned problems with memory devices and other problems are addressed by the present invention and will be understood by reading and studying the following specification.

The various embodiments of the invention include methods and apparatus for decoding an externally-applied address in a synchronous memory device arranged to decode a first portion of the address during a setup time and to decode a second portion of the address following the setup time. The first portion of the address may be indicative of a bank address of a multiple-bank memory device. The second portion of the address may be indicative of row and column addresses within a bank of the multiple-bank memory device.

For one embodiment, the invention provides an address input buffer stage. The address input buffer stage includes at least one address input for receiving at least one address input signal of an externally-applied address, a buffer coupled to each address input, an address decoder having each input coupled to a buffer, and latches coupled to each output of the address decoder through selective coupling devices.

For another embodiment, the invention provides an address input buffer stage. The address input buffer stage includes at least two buffers, each buffer coupled to an address input for receiving address input signals of an externally-applied address, at least three latches, and an address decoder coupled between the buffers and the latches.

For yet another embodiment, the invention provides a method of decoding an externally-applied address for a memory device. The method includes decoding at least a portion of address input signals of the externally-applied address prior to latching the portion of address input signals in the memory device. For still another embodiment, the method includes decoding at least a portion of address input signals of the externally-applied address without latching the portion of address input signals in the memory device.

For a further embodiment, the invention provides a method of accessing a target memory cell in a memory device having at least two memory banks. The method includes buffering at least one bank address input signal and remaining address input signals of an externally-applied address in the memory device, thereby generating at least one buffered bank address input signal and buffered remaining address input signals. The externally-applied address is indicative of a location of the target memory cell. The method further includes decoding a bank address from the at least one buffered bank address input signal prior to latching the at least one bank address input signal in the memory device, thereby generating a decoded bank address indicative of a target memory bank containing the target memory cell, delaying the buffered remaining address input signals while decoding the bank address, and latching the decoded bank address and the buffered remaining address input signals in the memory device at approximately the same time. The method still further includes selecting a row decoder circuit from a plurality of row decoder circuits in response to the decoded bank address, selecting a column decoder circuit from a plurality of column decoder circuits in response to the decoded bank address, decoding at least a portion of the buffered remaining address input signals using the selected row decoder circuit, thereby producing a decoded row address, and decoding at least a portion of the buffered remaining address input signals using the selected column decoder circuit, thereby producing a decoded column address. The method still further includes accessing the target memory cell in response to the decoded row address and the decoded column address.

For yet another embodiment, the invention provides a synchronous flash memory device. The memory device includes a plurality of address inputs having a first portion and a second portion, at least two memory banks containing arrays of non-volatile flash memory cells arranged in addressable rows and columns, a row decoder having at least two row decoder circuits coupled to the at least two memory banks, a column decoder having at least two column decoder circuits coupled to the at least two memory banks, and an address bus coupled to the row decoder and the column decoder. The memory device further includes a first address input buffer stage for providing a first decoded address to select a row decoder circuit from the row decoder and a column decoder circuit from the column decoder. The first address input buffer stage includes at least one buffer, wherein each buffer is coupled to one address input of the first portion of address inputs in a one-to-one relationship, an address decoder having at least one input and at least two outputs for providing the first decoded address, wherein each input of the address decoder is coupled to one of the buffers in a one-to-one relationship, and at least two latches, wherein an input of each latch is coupled to one of the outputs of the address decoder in a one-to-one relationship through a selective coupling device, further wherein an output of each latch is coupled to the row decoder and the column decoder. The memory device still further includes at least two second address input buffer stages coupled to the address bus for providing address input signals from the second portion of the address inputs to a selected row decoder circuit of the row decoder and a selected column decoder circuit of the column decoder, and a command execution logic for receiving at least a system clock input signal, for generating an internal clock signal in response to the system clock input signal, and for generating control signals to control operations performed by the row decoder, the column decoder, the first address input buffer stage and each second address input buffer stage synchronized to the internal clock signal.

The invention further provides methods and apparatus of varying scope.

BRIEF DESCRIPTION OF THE DRAWINGS

FIG. 6A is a top view of a memory assembly showing a package pin assignment diagram in accordance with the invention.

DETAILED DESCRIPTION OF THE INVENTION

Figure 1:
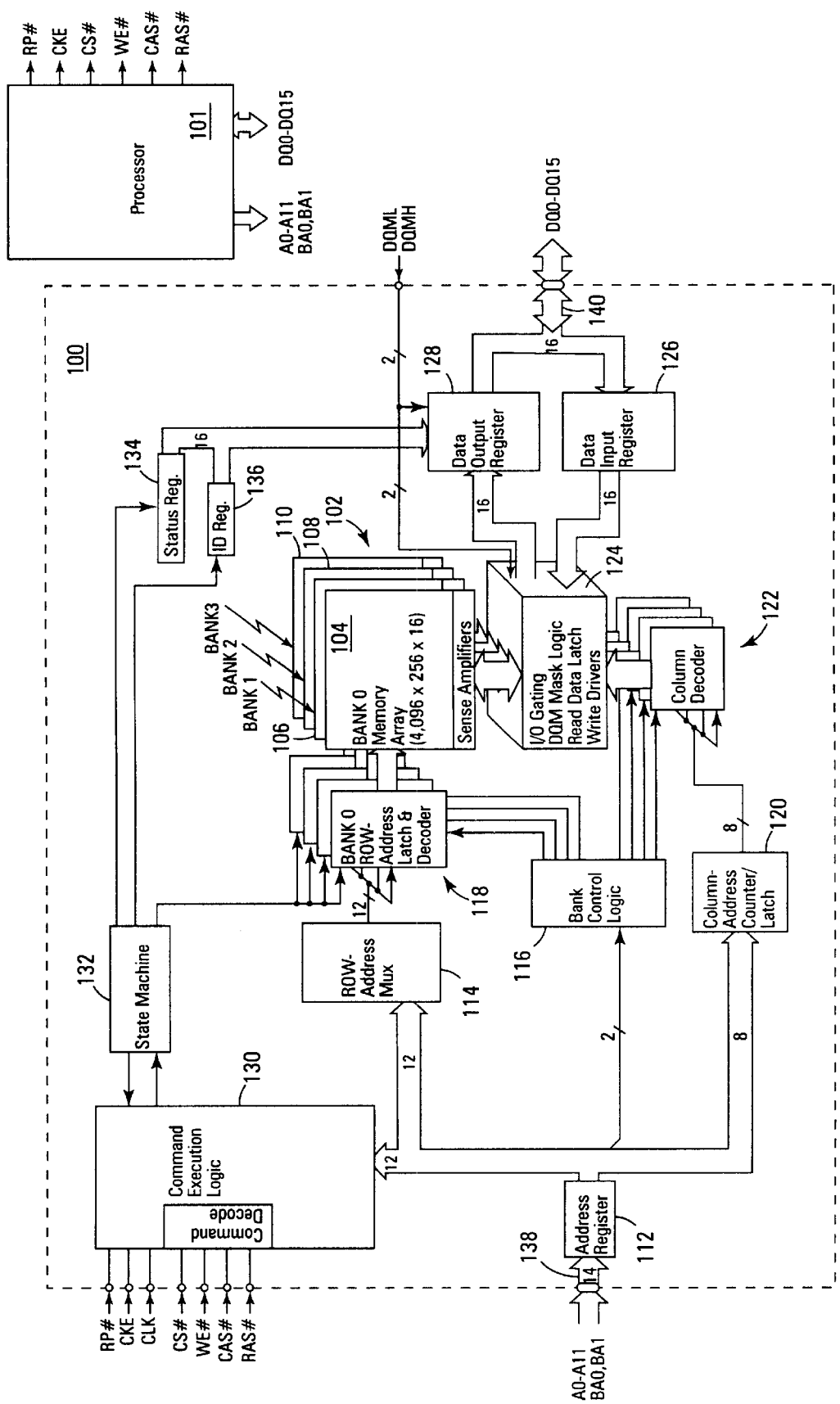
FIG. 1 is a block diagram of a synchronous memory device in accordance with the invention.

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof FIG. 1 is a block diagram of one embodiment of a synchronous memory device in accordance with the invention. The memory device 100 includes an array of non-volatile flash memory cells 102. All access commands to the array 102 of the memory device 100 are synchronized to a system clock input signal (CLK), thus the memory device 100 may be referred to as a synchronous flash memory device or synchronous non-volatile memory device.

The array 102 is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112 through a plurality of address inputs 138. The externally provided location addresses may be provided by a processor 101 of an electronic system as is known in the art. The addresses are decoded using row address multiplexer circuitry 114. The addresses are also decoded using bank control logic 116 and row address latch and decode circuitry 118. To access an appropriate column of the memory, column address counter and latch circuitry 120 couples the received addresses to column decode circuitry 122. Circuit 124 provides input/output (I/O) gating, data mask logic, read data latch circuitry and write driver circuitry. Data is input through data input registers 126 and output through data output registers 128 using a plurality of data inputs/outputs 140, which are generally coupled to the processor 101 of an electronic system. Command execution logic 130 is provided to generate commands, or control signals, to control the basic operations performed on the memory banks of the memory device. A state machine 132 is also provided to control specific operations performed on the memory banks. A status register 134 and an identification register 136 can also be provided to output data. The command circuit 130 and/or state machine 132 can be generally referred to as control circuitry to control read, write, erase and other memory operations. As is known in the art, integrated circuit memory devices of the type described with reference to FIG. 1 may be fabricated on a substrate, such as a semiconductor wafer, and may be referred to as a memory chip.

Figure 2:
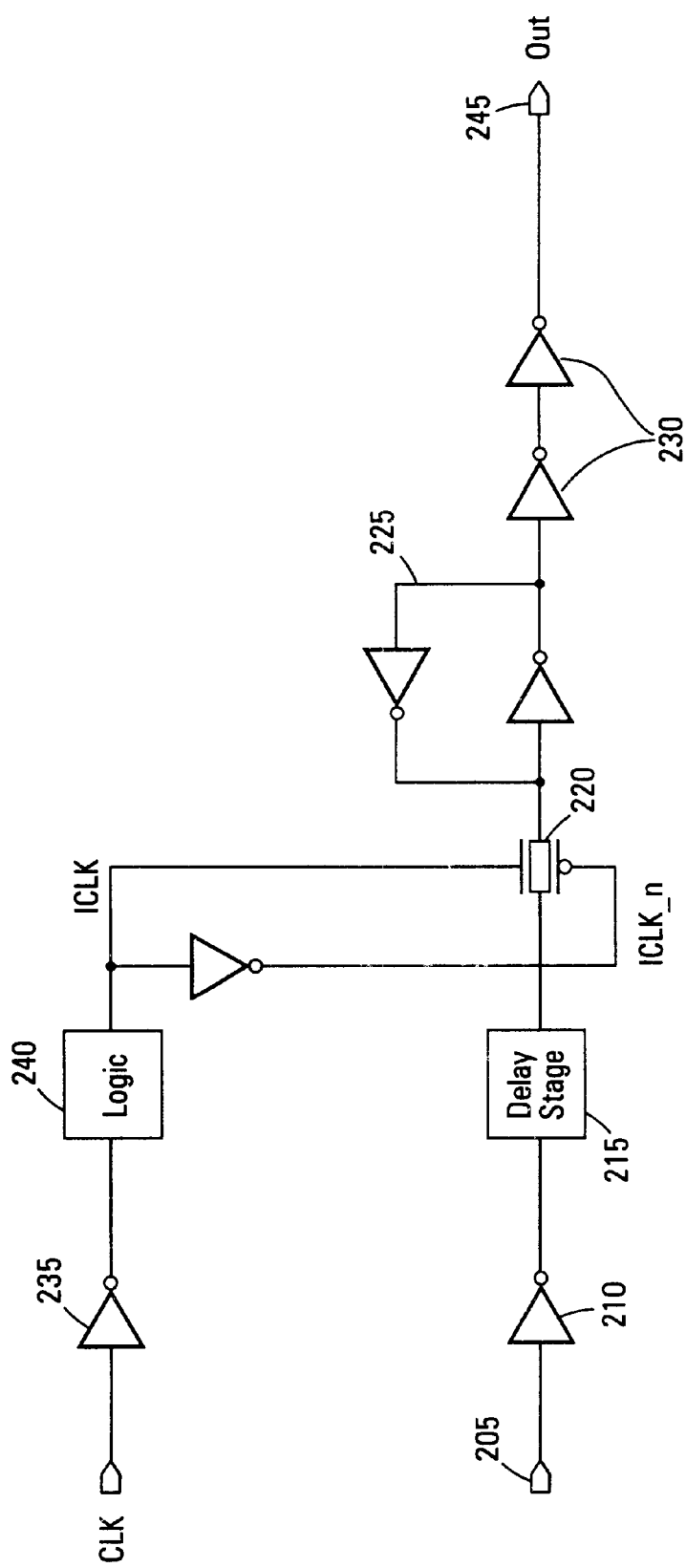
FIG. 2 is a schematic of a known input buffer stage.

Generally, all address and control inputs to a synchronous memory device are brought through an input buffer stage for performing the setup and hold time functions. The input buffer stage is often a part of an address register. FIG. 2 is a schematic of one example of a known input buffer stage 200 synchronized to an internal clock signal ICLK (and its complement ICLK_n). Input buffer stage 200 includes an input 0, such as one of the address inputs 138, coupled to the input of a buffer 210. The input 205 receives an address input signal or control input signal from an externally-applied address or control command, respectively. The output of the buffer 210 is coupled to the input of a delay stage 215. The output of the delay stage 215 is provided to a latch 225 through the transfer gate 220. As shown, the latch 225 may be a pair of reverse coupled inverter circuits, each having their output coupled to the other's input. The transfer gate 220 activates and selectively couples the output of the delay stage 215 to the latch 225 in response to the internal clock signal ICLK, such as in response to the rising edge of the clock signal. The transfer gate 220 may be any selective coupling device for selectively providing electrical communication in response to a control signal. The output of the latch 225 may be passed through additional inverters 230 acting as an additional buffer to further buffer the signal prior to output 245 for use by the memory device.

As the internal clock signal ICLK is generated from the system clock input signal CLK, such as by passing the system clock input signal CLK through a buffer 235 and a logic stage 240, the internal clock signal ICLK will be phase delayed from the system clock input signal CLK. As an example, this phase delay, or setup time, may be on the order of 2–3 ns in a 100 MHz system. In response to this setup time, the delay stage 215 is applied to the input 205 to avoid latching the wrong input signal in latch 225 in response to the internal clock signal ICLK, i.e., the input signal at input 205 is delayed for a time approximately equal to the setup time so that the proper input signal is latched in response to the rising edge of the internal clock signal ICLK. For the example of a 2–3 ns setup time, a typical delay stage may have a delay of approximately 1 ns.

In a multiple-bank memory device, such as memory device 100, the bank address must be decoded in order to direct the address bus to the target memory bank. In this example, the bank control logic 116 points to, or selects, the row decoder circuit of the row decoders 118 and the column decoder circuit of the column decoders 122 associated with the target memory bank 104, 106, 108, or 110. Thus, decoding of the bank address input signals BA0 and BA1 becomes the speed-critical path in that the remaining address input signals A0–A11 cannot properly be decoded by row decoders 118 and column decoders 122 until the bank address input signals have been decoded.

Figure 3A:
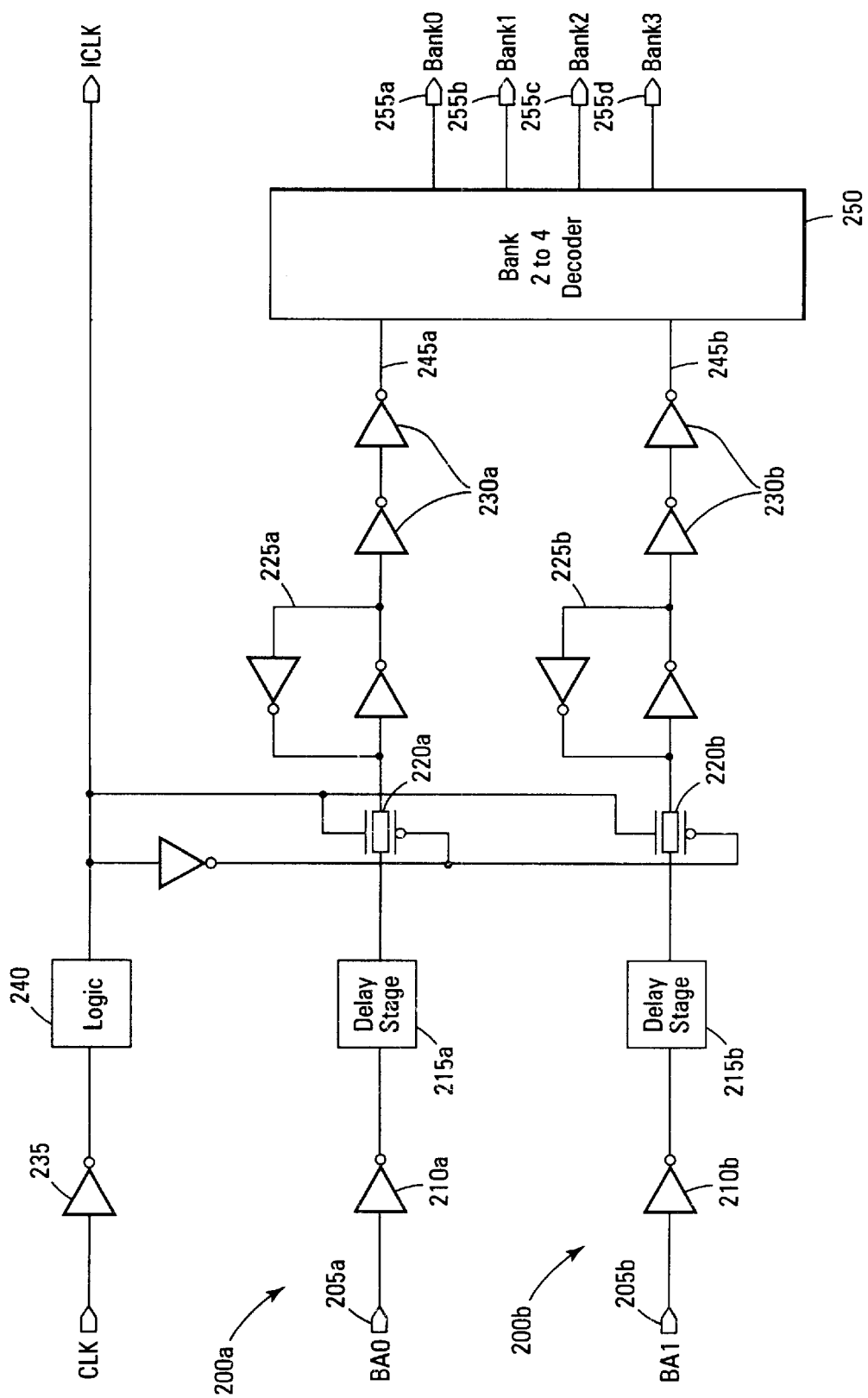
FIGS. 3A–3B are schematics of the known input buffer stages of FIG. 2 for use in a multiple-bank memory device.
Figure 3B:
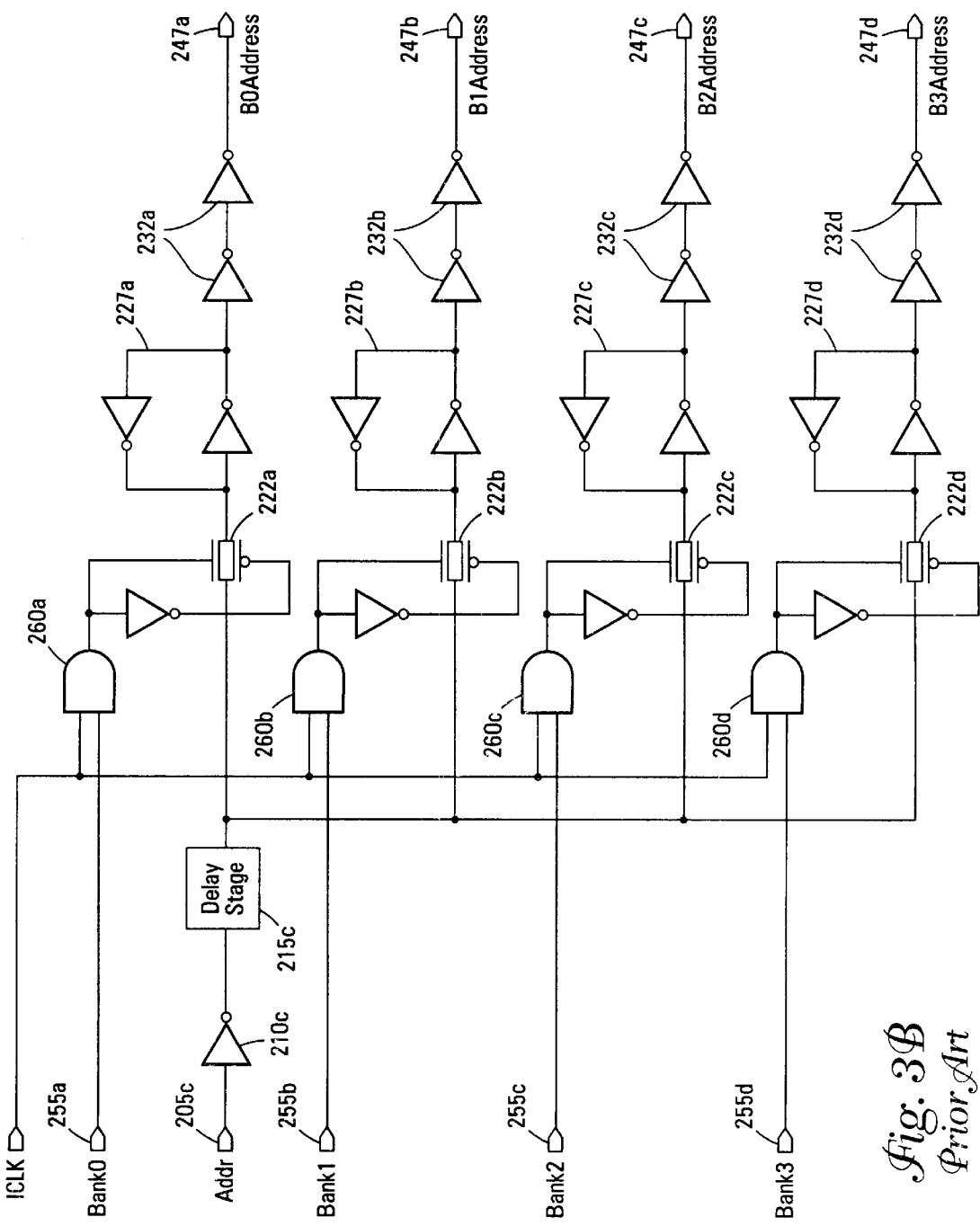

If all address inputs 138 were passed through a typical input buffer stage 200, the bank address input signals BA0 and BA1 would be ready for decoding at approximately the same time as the remaining address input signals A0–A11. In this situation, decoding of the remaining address input signals A0–A11 would generally be delayed until decoding of the bank address input signals BA0 and BA1 was complete as the decoded bank address is required to direct the remaining address input signals A0–A11 to the proper decoders. FIGS. 3A–3B are schematics showing the use of the typical input buffer stage 200 of FIG. 2 for a multiple-bank memory device. As noted above, bank address decoding is performed prior to directing the remaining address input signals A0–A11 to their proper decoders.

As shown in FIG. 3A, two input buffer stages 200a and 200b are first used to bring in the bank address input signals BA0 and BA1. The bank address input signals BA0 and BA1 are latched in response to the internal clock signal ICLK as discussed with reference to FIG. 2. The input signal are then made available to outputs 245a and 245b of the input buffer stages 200a and 200b, respectively, for input to a bank decoder 250 for decoding. The resulting decoded bank address input signals Bank0, Bank1, Bank2 and Bank3 are provided on decoder outputs 255a, 255b, 255c and 255d, respectively.

The decoded bank address signals Bank0, Bank1, Bank2 and Bank3 are used in conjunction with the internal clock signal ICLK to control latching of remaining address signals A0–A11 provided on input 205c as shown in FIG. 3B. The input buffer stage for the remaining address signals A0–A11 will be recognized as a modified version of the input buffer stage 200 of FIG. 2. The remaining address signals A0–A11 are buffered and delayed by buffer 210c and delay stage 215c prior to latching. At this point, the output of the delay stage 215c is provided with an output path for each bank of the multiple-bank memory device. As shown, each decoded bank address signal is supplied to an AND gate 260, in its associated output path, as a first input. The internal clock signal ICLK is supplied to each AND gate 260 as a second input. When both signals are logic high on one AND gate 260, the buffered and delayed remaining address signals A0–A11 are passed by the associated transfer gate 222 and latched by the associated latch 227. The latched remaining address signals A0–A11 may be further buffered by the associated inverter stages 232. Note that only one transfer gate 222 will be activated in response to a rising edge of the internal clock signal ICLK as only one of the decoded bank address input signals Bank0, Bank1, Bank2 or Bank3 will be logic high at any given time in routine operation. The remaining address input signals A0–A11 will then be directed to one of the outputs 247 for use by the target bank of the memory device. As shown in FIGS. 3A–3B, the latching of the remaining address input signals A0–A11 must be delayed until after decoding of the bank address input signals BA0 and BA1 in order to activate the appropriate transfer gate 222. Such delays potentially slow access time to the memory device.

Figure 4:
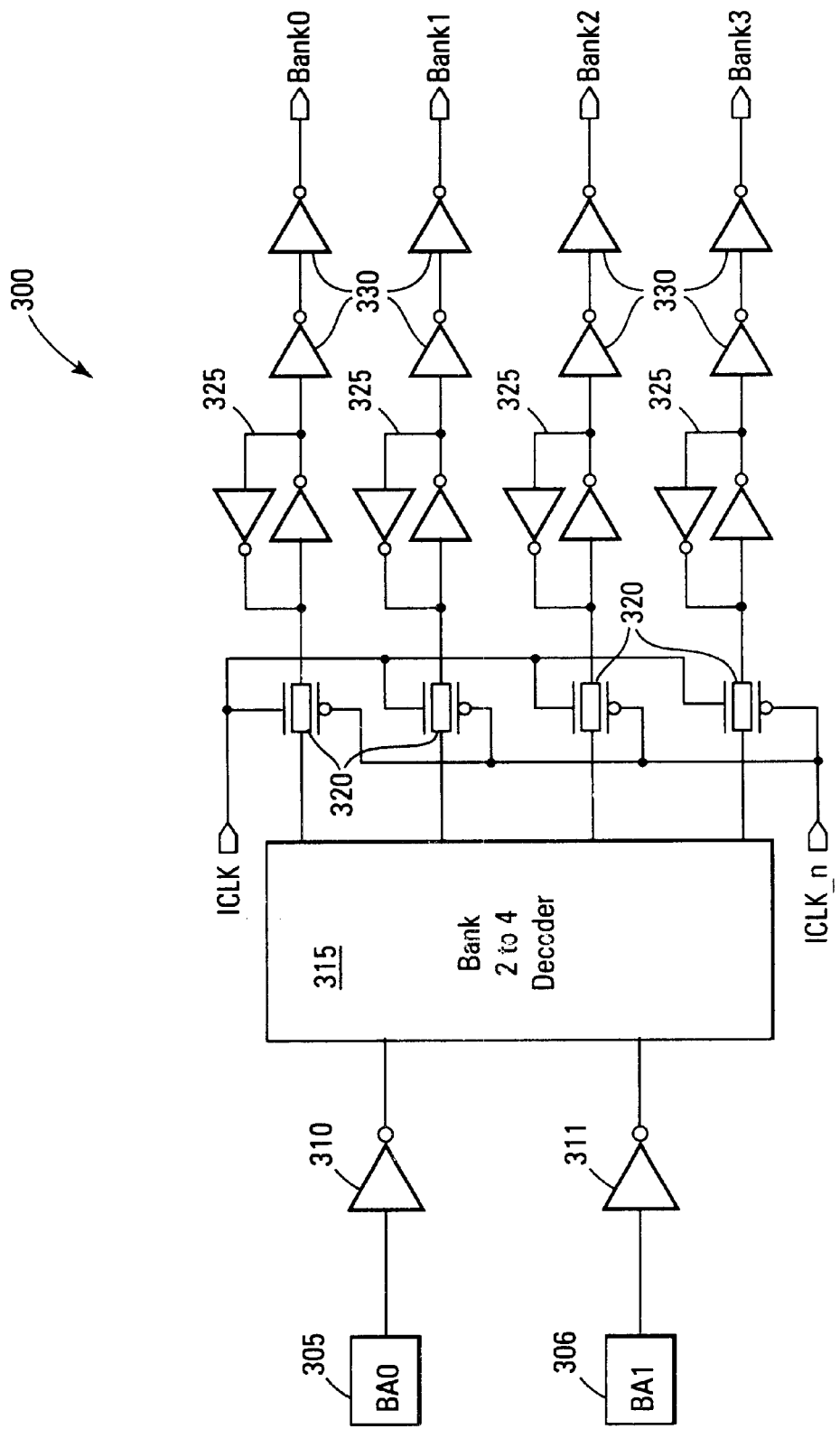
FIG. 4 is a schematic of an input buffer stage in accordance with the invention.

To avoid such delays, the various embodiments of the invention utilize an alternate input buffer stage for such speed-critical address input signals, such as bank address input signals BA0 and BA1. FIG. 4 is a schematic of an address input buffer stage 300 in accordance with the invention. The address input buffer stage 300 is applied to that portion of the address to be decoded prior to the remaining portion. As such, the address input buffer stage 300 performs the setup and hold functions for the bank address input signals BA0 and BA1, and may be referred to as a bank address input buffer stage. In general, the delay stage of a typical input buffer stage is replaced by an address decoder. The decoder preferably has a gate delay less than or equal to the setup time, and approximately equal to the delay stages of the input buffer stages of the remaining address inputs A0–A11. In this manner, the bank address input signals BA0 and BA1 are decoded prior to latching in the input buffer stage. Thus, the decoded bank address is available to direct the address bus without further delay of the remaining address input signals A0–A11. Accordingly, delays in access time are reduced, thus improving device performance. For decoders having gate delays of substantially less than the setup time or the delay stages of the remaining input buffer stages, separate delay stages may be added to each input or output of the decoder to provide additional delay.

The bank address input buffer stage 300 includes a first bank address input 305 for receiving the bank address input signal BA0 and a second bank address input 306 for receiving the bank address input signal BA1 from the externally-applied bank address. The first bank address input 305 is coupled to the input of a first buffer 310 while the second bank address input 306 is coupled to the input of a second buffer 311. The output of each buffer 310 and 311 is coupled to the input of the bank address decoder 315. A decoder as used herein has at least one input and at least two outputs, wherein the state of the at least one input uniquely determines the state of each of the at least two outputs. In general, for decoder inputs having some combination of first and second logic levels, the first logic level will be presented on one decoder output while the remaining decoder outputs will have the second logic level.

In the example of FIG. 4, the bank address decoder 315 is a 2-to-4 decoder, having two inputs and four outputs for resolving between the four memory banks 104, 106, 108 and 110 using two bank address input signals BA0 and BA1. It should be apparent that additional bank address input signals could be coupled to a bank address decoder in like manner for resolving bank addresses in memory devices containing more than four memory banks, e.g., three bank address input signals to resolve between eight memory banks using a 3-to-8 decoder. Each output of the bank address decoder 315 is coupled to a latch 325 through a transfer gate 320. The state of the outputs of the bank address decoder 315 is indicative of the decoded bank address. The transfer gates 320 activate and selectively couple the outputs of the bank address decoder 315 to the latches 325 in response to the internal clock signal ICLK, such as in response to the rising edge of the clock signal. The transfer gates 320 may be any selective coupling devices for selectively providing electrical communication in response to a control signal. The output of each latch 325 may be passed through additional inverters 330 acting as additional buffers to further buffer the signals prior to output for use by the memory device. If additional delay is desired prior to latching, delay stages are preferably added between each buffer 310/311 and the bank address decoder 315. However, such delay may be added anywhere prior to the transfer gates 320.

Figure 5:
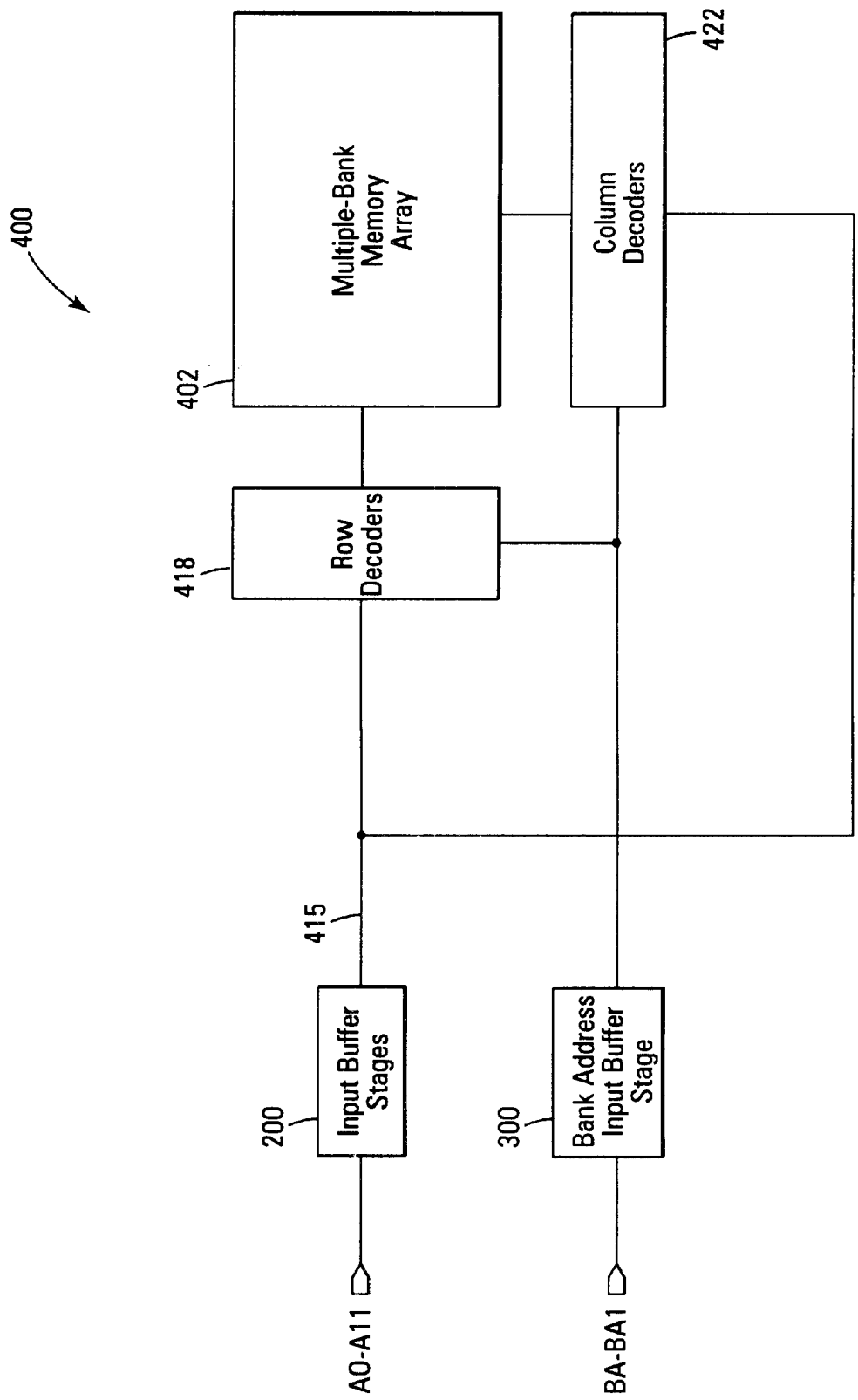
FIG. 5 is a simplified block diagram of a synchronous memory device in accordance with the invention.

For one embodiment, bank address input signals of a multiple-bank synchronous memory device are passed through a bank address input buffer stage of the type described with reference to FIG. 4 having a decoder prior to the latches, such that the bank address is decoded prior to, and without, latching the bank address input signals in the memory device. The remaining address input signals of the multiple-bank synchronous memory device are concurrently passed through an address input buffer stage of the type described with reference to FIG. 2 having a delay stage prior to the latches, such that the row and column addresses are decoded subsequent to latching the remaining address input signals in the memory device. FIG. 5 is a simplified block diagram showing one such embodiment. In FIG. 5, memory device 400 receives bank address input signals BA0–BA1 indicative of a bank address and remaining address input signals A0–A11 indicative of row and column addresses. The bank address inputs are coupled to a bank address input buffer stage 300 for decoding of the bank address inputs prior to latching in the memory device 400. As such, each bank address input signal is buffered, decoded prior to latching, and latched for use by the memory device. The remaining address inputs are coupled to one or more second address input buffer stages 200 in a one-to-one relationship and are latched in the memory device 400 prior to decoding. As such, each remaining address input is buffered, delayed, and latched for use by the memory device prior to decoding. The bank address input buffer stage 300 is coupled to the row decoder 418 having a row decoder circuit associated with each memory bank of the memory array 402. Alternatively, the bank address input buffer stage 300 may be coupled directly to the second address input buffer stages 200 for control of the transfer gates 222 as shown in FIG. 3B. The bank address input buffer stage 300 is further coupled to the column decoder 422 having a column decoder circuit associated with each memory bank of the memory array 402. The second address input buffer stages 200 are coupled to the row decoder 418 and column decoder 422 through the address bus 415. A row decoder circuit associated with a target memory bank is selected from the row decoder 418 in response to output signals of the bank address input buffer stage 300, i.e., at least a portion of address input signals of the address bus 415 is directed to the row decoder circuit associated with the target memory bank in response to the decoded bank address. A column decoder circuit associated with a target memory bank is selected from the column decoder 422 in response to output signals of the bank address input buffer stage 300, i.e., at least a portion of address input signals of the address bus 415 is directed to the column decoder circuit associated with the target memory bank in response to the decoded bank address. The remaining address input signals A0–A11 are then decoded by the selected row and column decoder circuits, and a target memory cell of the target memory bank of the memory array 402 is accessed in response to the decoded row and column addresses as described herein and as generally known in the art.

Memory devices in accordance with the invention may be assembled in a package having interconnects for receiving power inputs, clock and control signal inputs and address inputs, and for providing data I/O between the memory device and external devices.

FIG. 6A illustrates an interconnect pin assignment of one embodiment of the present invention as a memory assembly having a pin layout substantially similar to a standard SDRAM 54-pin TSOP (thin small-outline package) package. Accordingly, the memory assembly has a memory package 150 having 54 interconnect pins and a memory device (not shown) in accordance with the invention. The memory device is contained in the memory package 150. The address inputs, data inputs/outputs, power inputs and clock and control signal inputs of the memory device are coupled to the interconnect pins of the memory package 150 in a conventional manner. Two interconnects shown in the embodiment of FIG. 6A and not present in standard SDRAM packages include control signal RP# and power input VccP. Although knowledge of the function of the various clock and control signals and the various power inputs is not essential to understanding the present invention, a detailed discussion is included in U.S. patent application Ser. No. 09/567,733 filed May 10, 2000 and titled, "Flash with Consistent Latency," which is commonly assigned.

Figure 6B:
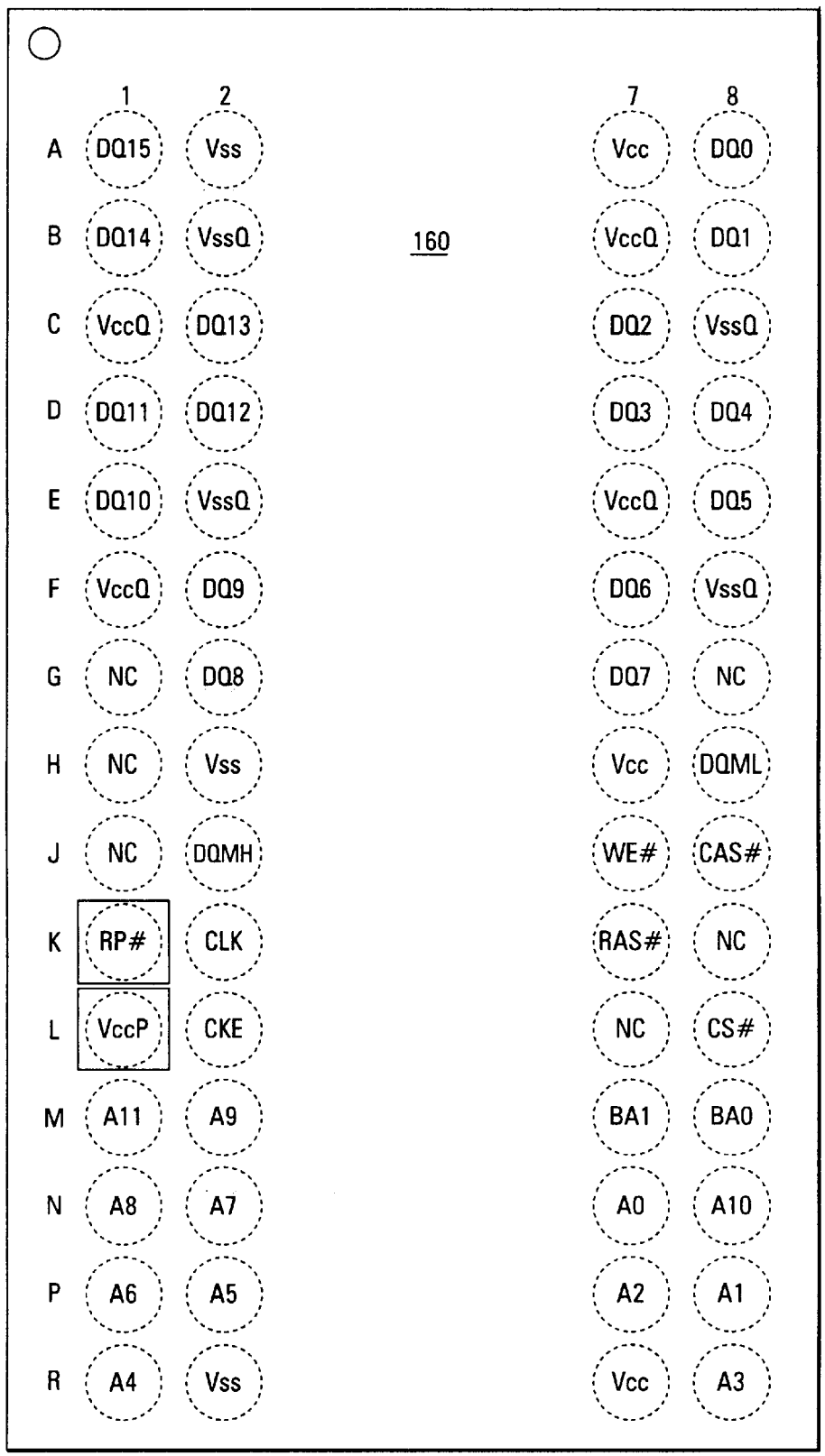
FIG. 6B is a top view of a memory assembly showing a package bump assignment diagram in accordance with the invention.

FIG. 6B illustrates a bump assignment of one embodiment of the present invention as a memory assembly having a bump layout substantially similar to an industry standard SDRAM 60-bump FBGA (fine-pitch ball grid array) package. Memory package 160 is generally similar to memory package 150 except that the interconnects of memory package 160 have bump connections instead of the pin connections of memory package 150. The present invention, therefore, is not limited to a specific package configuration. Furthermore, the invention is not limited to memory packages having pin or bump layouts substantially similar to the interconnect layout of an industry-standard SDRAM package, but is applicable to other memory packages having memory devices containing input buffer stages in accordance with the various embodiments of the invention.

CONCLUSION

Address resolution within multiple-bank synchronous memory devices presents timing concerns when the bank address must be resolved prior to decoding the row and column addresses. Bank address input buffer stages are described herein for combining bank address decoding with setup and hold time functions. Such bank address input buffer stages generally replace a delay stage of a typical input buffer stage with the bank address decoder, essentially decoding the bank address prior to latching the bank address in the memory device. By decoding the bank address prior to latching in the memory device, the decoded bank address is available to direct the address bus to the target memory bank at approximately the same time as the remaining address input signals are latched and available for decoding. Accordingly, access times of the memory device may be reduced.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory device address input buffer stage, comprising:
    at least one address input for receiving at least one address input signal of an externally-applied address;
    at least one buffer, wherein each buffer is coupled to one of the at least one address inputs in a one-to-one relationship;
    an address decoder having at least one input and at least two outputs, wherein each input of the address decoder is coupled to one of the at least one buffers in a one-to-one relationship to receive an address input signal substantially without delay; and
    at least two latches, wherein each latch is coupled to one of the outputs of the address decoder in a one-to-one relationship through a selective coupling device.

2. The memory device address input buffer stage of claim 1, wherein the address decoder is a 2-to-4 decoder having two inputs and four outputs, and the address input buffer stage comprises two address inputs for receiving two address input signals, two buffers coupled to the two address inputs, and four latches coupled to the four outputs of the address decoder through selective coupling devices.

3. A memory device address input buffer stage, comprising:
    a first address input;
    a second address input;
    an address decoder having two inputs and four outputs;
    a first buffer coupled between the first address input and a first input of the address decoder with no interposing delay stage between the first input of the address decoder and the first address input;
    a second buffer coupled between the second address input and a remaining input of the address decoder with no interposing delay stage between the second input of the address decoder and the second address input;
    four latches, wherein each latch is coupled to each of the outputs of the address decoder in a one-to-one relationship through a selective coupling device.

4. A memory device address input buffer stage, comprising:
    a first address input;
    a second address input;
    an address decoder having a first input and a second input, and having a first output, a second output, a third output and a fourth output;
    a first buffer coupled between the first address input and the first input of the address decoder, wherein the first buffer is coupled to receive an address signal from the first address input and to provide it to the first input of the address decoder substantially without delay;
    a second buffer coupled between the second address input and the second input of the address decoder, wherein the second buffer is coupled to receive an address signal from the second address input and to provide it to the second input of the address decoder substantially without delay;
    a first latch coupled to the first output of the address decoder through a first selective coupling device;
    a second latch coupled to the second output of the address decoder through a second selective coupling device;
    a third latch coupled to the third output of the address decoder through a third selective coupling device; and
    a fourth latch coupled to the fourth output of the address decoder through a fourth selective coupling device.

5. A memory device address input buffer stage, comprising:
    at least two buffers, each buffer coupled to an address input for receiving address input signals of an externally-applied address;
    at least three latches; and
    an address decoder coupled between the buffers and the latches with no interposing delay stage between the address decoder and any of the address inputs.

6. The address input buffer stage of claim 5, wherein the address decoder is a 2-to-4 decoder having two inputs and four outputs, and wherein each output of the address decoder is coupled to one of the latches in a one-to-one relationship through a selective coupling device.

7. A method of decoding an externally-applied address for a memory device, comprising:

decoding a first portion of address input signals of the externally-applied address during a setup time for a second portion of the address input signals and prior to latching the first portion of the address input signals in the memory device.

8. A method of decoding an externally-applied address for a memory device, comprising:

decoding at least a portion of address input signals of the externally-applied address substantially without delay after receiving the portion of the address input signals and without latching the portion of the address input signals in the memory device.

9. A method of decoding an externally-applied address for a memory device, comprising:

buffering address input signals of the externally-applied address in the memory device, thereby generating buffered address input signals;

decoding at least a portion of the externally-applied address from the buffered address input signals prior to latching the buffered address input signals in the memory device, thereby generating a decoded address, wherein decoding occurs substantially without delay after generating the buffered address signals; and latching the decoded address in the memory device.

10. A method of decoding an externally-applied address for a memory device, comprising:

buffering address input signals of the externally-applied address in the memory device, thereby generating buffered address input signals;

decoding a first portion of the externally-applied address from a first portion of the buffered address input signals prior to latching the first portion of the address input signals in the memory device, thereby generating a first decoded address;

delaying a second portion of the buffered address input signals while decoding the first portion of the externally-applied address;

latching the first decoded address and the second portion of the buffered address input signals in the memory device at approximately the same time;

selecting a decoder circuit from a plurality of decoder circuits in response to the first decoded address; and decoding a second portion of the externally-applied address from the second portion of the buffered address input signals using the selected decoder circuit, thereby producing a second decoded address.

11. The method of claim 10, wherein the method is performed in the order presented.

12. A method of decoding an externally-applied address for a memory device having at least two memory banks, comprising:

buffering bank address input signals and remaining address input signals of the externally-applied address in the memory device, thereby generating buffered bank address input signals and buffered remaining address input signals;

decoding a bank address from the buffered bank address input signals without latching the bank address input signals in the memory device, thereby generating a decoded bank address;

delaying the buffered remaining address input signals while decoding the bank address;

latching the decoded bank address and the buffered remaining address input signals in the memory device at approximately the same time;

selecting a row decoder circuit from a plurality of row decoder circuits in response to the decoded bank address;

selecting a column decoder circuit from a plurality of column decoder circuits in response to the decoded bank address;

decoding at least a portion of the buffered remaining address input signals using the selected row decoder circuit, thereby producing a decoded row address; and decoding at least a portion of the buffered remaining address input signals using the selected column decoder circuit, thereby producing a decoded column address.

13. The method of claim 12, wherein the method is performed in the order presented.

14. A method of accessing a target memory cell in a memory device having at least two memory banks, comprising:

buffering at least one bank address input signal and remaining address input signals of an externally-applied address in the memory device, thereby generating at least one buffered bank address input signal and buffered remaining address input signals, wherein the externally-applied address is indicative of a location of the target memory cell;

decoding a bank address from the at least one buffered bank address input signal prior to latching the at least one bank address input signal in the memory device, thereby generating a decoded bank address indicative of a target memory bank containing the target memory cell;

delaying the buffered remaining address input signals while decoding the bank address;

latching the decoded bank address and the buffered remaining address input signals in the memory device at approximately the same time;

selecting a row decoder circuit from a plurality of row decoder circuits in response to the decoded bank address;

selecting a column decoder circuit from a plurality of column decoder circuits in response to the decoded bank address;

decoding at least a portion of the buffered remaining address input signals using the selected row decoder circuit, thereby producing a decoded row address;

decoding at least a portion of the buffered remaining address input signals using the selected column decoder circuit, thereby producing a decoded column address; and accessing the target memory cell in response to the decoded row address and the decoded column address.

15. The method of claim 14, wherein the method is performed in the order presented.

16. The method of claim 14, wherein the memory device has at least four memory banks and the externally-applied address has at least two bank address input signals.

17. The method of claim 14, wherein the bank address is decoded without latching the bank address input signals in the memory device.

18. A method of accessing a target memory cell in a memory device having four memory banks, comprising:

buffering a first bank address input signal, a second bank address input signal and remaining address input signals of an externally-applied address in the memory device, thereby generating a buffered first bank address input signal, a buffered second bank address input signal and buffered remaining address input signals, wherein the externally-applied address is indicative of a location of the target memory cell;

decoding a bank address from the buffered first and second bank address input signals prior to latching the first and second bank address input signals in the memory device, thereby generating a decoded bank address indicative of a target memory bank containing the target memory cell;

delaying the buffered remaining address input signals while decoding the bank address;

latching the decoded bank address and the buffered remaining address input signals in the memory device at approximately the same time;

selecting a row decoder circuit associated with the target memory bank in response to the decoded bank address;

selecting a column decoder circuit associated with the target memory bank in response to the decoded bank address;

decoding at least a portion of the buffered remaining address input signals using the selected row decoder circuit, thereby producing a decoded row address;

decoding at least a portion of the buffered remaining address input signals using the selected column decoder circuit, thereby producing a decoded column address; and accessing the target memory cell in response to the decoded row address and the decoded column address.

19. The method of claim 18, wherein the method is performed in the order presented.

20. The method of claim 18, wherein the bank address is decoded without latching the bank address input signals in the memory device.

21. A multiple-bank memory device, comprising:

a plurality of address inputs having a first portion and a second portion;

at least two memory banks containing arrays of memory cells arranged in addressable rows and columns;

a row decoder having at least two row decoder circuits coupled to the at least two memory banks;

a column decoder having at least two column decoder circuits coupled to the at least two memory banks;

an address bus coupled to the row decoder and the column decoder;

a first address input buffer stage for providing a first decoded address to select a row decoder circuit from the row decoder and a column decoder circuit from the column decoder, wherein the first address input buffer stage comprises:

at least one buffer, wherein each buffer is coupled to one address input of the first portion of address inputs in a one-to-one relationship;

an address decoder having at least one input and at least two outputs for providing the first decoded address, wherein each input of the address decoder is coupled to one of the buffers in a one-to-one relationship; and at least two latches, wherein an input of each latch is coupled to one of the outputs of the address decoder in a one-to-one relationship through a selective coupling device, further wherein an output of each latch is coupled to the row decoder and the column decoder; and at least two second address input buffer stages coupled to the address bus for providing address input signals from the second portion of the address is inputs to a selected row decoder circuit of the row decoder and a selected column decoder circuit of the column decoder.

22. The multiple-bank memory device of claim 21, wherein there are two address inputs in the first portion of address inputs and twelve address inputs in the second portion of address inputs, and wherein the address decoder is a 2-to-4 decoder.

23. The multiple-bank memory device of claim 21, wherein each second address input buffer stage comprises:

a buffer coupled to one of the address inputs of the second portion of address inputs;

a delay stage coupled to the buffer; and a latch coupled to the delay stage through a selective coupling device;

wherein the selective coupling device of each second address input buffer stage is adapted to activate in response to an edge of an internal clock signal; and wherein each selective coupling device of the first address input buffer stage is adapted to activate in response to the edge of the internal clock signal.

24. A multiple-bank memory device, comprising:

a plurality of address inputs having a first portion and a second portion;

at least two memory banks containing arrays of memory cells arranged in addressable rows and columns;

a row decoder having at least two row decoder circuits coupled to the at least two memory banks;

a column decoder having at least two column decoder circuits coupled to the at least two memory banks;

an address bus coupled to the row decoder and the column decoder;

a first address input buffer stage for providing a first decoded address to select a row decoder circuit from the row decoder and a column decoder circuit from the column decoder, wherein the first address input buffer stage comprises:

an address decoder for providing the first decoded address, wherein the address decoder has a first input and a second input, wherein the address decoder further has a first output, a second output, a third output and a fourth output;

a first buffer coupled between a first address input of the first portion of address inputs and the first input of the address decoder;

a second buffer coupled between a second address input of the first portion of address inputs and the second input of the address decoder;

a first latch having an input coupled to the first output of the address decoder through a first selective coupling device, and having an output coupled to the row decoder and the column decoder;

a second latch having an input coupled to the second output of the address decoder through a second selective coupling device, and having an output coupled to the row decoder and the column decoder;

a third latch having an input coupled to the third output of the address decoder through a third selective coupling device, and having an output coupled to the row decoder and the column decoder; and a fourth latch having an input coupled to the fourth output of the address decoder through a fourth selective coupling device, and having an output coupled to the row decoder and the column decoder; and at least two second address input buffer stages coupled to the address bus for providing address input signals from the second portion of the address inputs to a selected row decoder circuit of the row decoder and a selected column decoder circuit of the column decoder.

25. A method of accessing a target memory cell in a synchronous non-volatile memory device having at least two memory banks of non-volatile memory cells, comprising:

buffering at least one bank address input signal and remaining address input signals of an externally-applied address in the memory device, thereby generating at least one buffered bank address input signal and buffered remaining address input signals, wherein the externally-applied address is indicative of a location of the target memory cell;

decoding a bank address from the at least one buffered bank address input signal during a setup time of the memory device, thereby generating a decoded bank address indicative of a target memory bank containing the target memory cell;

delaying the buffered remaining address input signals during the setup time;

latching the decoded bank address and the buffered remaining address input signals in the memory device in response to an edge of an internal clock signal, thereby generating a latched decoded bank address and latched buffered remaining address input signals;

selecting a row decoder circuit from a plurality of row decoder circuits in response to the latched decoded bank address;

selecting a column decoder circuit from a plurality of column decoder circuits in response to the latched decoded bank address;

decoding at least a portion of the latched buffered remaining address input signals using the selected row decoder circuit, thereby producing a decoded row address;

decoding at least a portion of the latched buffered remaining address input signals using the selected column decoder circuit, thereby producing a decoded column address; and accessing the target memory cell in response to the decoded row address and the decoded column address.

26. A synchronous flash memory device, comprising:

a plurality of address inputs having a first portion and a second portion;

at least two memory banks containing arrays of non-volatile flash memory cells arranged in addressable rows and columns;

a row decoder having at least two row decoder circuits coupled to the at least two memory banks;

a column decoder having at least two column decoder circuits coupled to the at least two memory banks;

an address bus coupled to the row decoder and the column decoder;

a first address input buffer stage for providing a first decoded address to select a row decoder circuit from the row decoder and a column decoder circuit from the column decoder, wherein the first address input buffer stage comprises:

at least one buffer, wherein each buffer is coupled to one address input of the first portion of address inputs in a one-to-one relationship;

an address decoder having at least one input and at least two outputs for providing the first decoded address, wherein each input of the address decoder is coupled to one of the buffers in a one-to-one relationship; and at least two latches, wherein an input of each latch is coupled to one of the outputs of the address decoder in a one-to-one relationship through a selective coupling device, further wherein an output of each latch is coupled to the row decoder and the column decoder;

at least two second address input buffer stages coupled to the address bus for providing address input signals from the second portion of the address inputs to a selected row decoder circuit of the row decoder and a selected column decoder circuit of the column decoder; and a command execution logic for receiving at least a system clock input signal, for generating an internal clock signal in response to the system clock input signal, and for generating control signals to control operations performed by the row decoder, the column decoder, the first address input buffer stage and each second address input buffer stage synchronized to the internal clock signal.

27. The multiple-bank memory device of claim 26, wherein each second address input buffer stage comprises:

a buffer coupled to one of the address inputs of the second portion of address inputs;

a delay stage coupled to the buffer; and a latch coupled to the delay stage through a selective coupling device;

wherein the selective coupling device of each second address input buffer stage is adapted to activate in response to an edge of the internal clock signal; and wherein each selective coupling device of the first address input buffer stage is adapted to activate in response to the edge of the internal clock signal.

28. A synchronous flash memory device, comprising:

a plurality of address inputs having a first portion and a second portion;

at least two memory banks containing arrays of non-volatile flash memory cells arranged in addressable rows and columns;

a row decoder having at least two row decoder circuits coupled to the at least two memory banks;

a column decoder having at least two column decoder circuits coupled to the at least two memory banks;

an address bus coupled to the row decoder and the column decoder;

a first address input buffer stage for providing a first decoded address to select a row decoder circuit from the row decoder and a column decoder circuit from the column decoder, wherein the first address input buffer stage comprises:

an address decoder for providing the first decoded address, wherein the address decoder has a first input and a second input, wherein the address decoder further has a first output, a second output, a third output and a fourth output;

a first buffer coupled between a first address input of the first portion of address inputs and the first input of the address decoder;

a second buffer coupled between a second address input of the first portion of address inputs and the second input of the address decoder;

a first latch having an input coupled to the first output of the address decoder through a first selective coupling device, and having an output coupled to the row decoder and the column decoder;

a second latch having an input coupled to the second output of the address decoder through a second selective coupling device, and having an output coupled to the row decoder and the column decoder;

a third latch having an input coupled to the third output of the address decoder through a third selective coupling device, and having an output coupled to the row decoder and the column decoder; and a fourth latch having an input coupled to the fourth output of the address decoder through a fourth selective coupling device, and having an output coupled to the row decoder and the column decoder;

at least two second address input buffer stages coupled to the address bus for providing address input signals from the second portion of the address inputs to a selected row decoder circuit of the row decoder and a selected column decoder circuit of the column decoder; and a command execution logic for receiving at least a system clock input signal, for generating an internal clock signal in response to the system clock input signal, and for generating control signals to control operations performed by the row decoder, the column decoder, the first address input buffer stage and each second address input buffer stage synchronized to the internal clock signal.

29. The synchronous flash memory device of claim 28, wherein the memory device is contained in a memory package having a plurality of interconnects having a layout substantially similar to an industry-standard synchronous dynamic random access memory interconnect layout, and wherein the plurality of address inputs of the memory device are coupled to a plurality of address input interconnects of the memory package.

30. A synchronous flash memory device, comprising:
an array of non-volatile flash memory cells arranged in addressable banks of rows and columns;
a first plurality of address inputs to receive externally-applied bank address input signals;
a bank address decode circuitry coupled to receive the bank address input signals and provide at least two decoded bank address output signals;
latch circuitry coupled to the bank address decode circuitry to latch the decoded bank address output signals; and
a command execution logic for receiving at least a system clock input signal, for generating an internal clock signal in response to the system clock input signal, and for generating control signals to control operations performed on the array of non-volatile flash memory cells synchronized to the internal clock signal.

31. The synchronous flash memory device of claim 30, further comprising buffer circuitry coupled between the bank address decode circuitry and the first plurality of address inputs.

32. The synchronous flash memory device of claim 30, further comprising:
a second plurality of address inputs to receive externally-applied row and column address input signals;
row and column address decoder circuitry coupled to receive the row and column address input signals; and
latches coupled between the second plurality of address inputs and the row and column address decoder circuitry.

33. The synchronous flash memory device of claim 30, wherein the bank address decoder circuitry is coupled to receive a first and a second bank address input signal and to provide four decoded bank address output signals.

34. The synchronous flash memory device of claim 33, wherein the latch circuitry comprises four latches coupled to receive the four decoded bank address output a signals, and each latch comprises a pair of reverse coupled inverter circuits.

35. The synchronous flash memory device of claim 34, further comprising transfer gates between the bank address decoder circuitry and each latch.

36. A memory assembly, comprising:
a memory package having a plurality of interconnects; and
a memory device contained in the memory package, wherein the memory device comprises:
a memory array arranged in multiple banks of addressable rows and columns;
at least one address input for receiving at least one bank address input signal of an externally-applied bank address;
at least one buffer, wherein each buffer is coupled to one of the at least one address inputs in a one-to-one relationship;
an address decoder having at least one input and at least two outputs, wherein each input of the address decoder is coupled to one of the at least one buffers in a one-to-one relationship;
at least two latches, wherein each latch is coupled to one of the outputs of the address decoder in a one-to-one relationship through a selective coupling device;
address inputs coupled between the memory array and a first portion of the plurality of interconnects of the memory package;
data inputs/outputs coupled between the memory array and a second portion of the plurality of interconnects of the memory package;
power inputs coupled between the memory array and a third portion of the plurality of interconnects of the memory package;
clock and control signal inputs coupled between the memory array and a fourth portion of the plurality of interconnects of the memory package; and
a command execution logic coupled to the memory array for receiving at least a system clock input signal from the clock and control signal inputs and for generating commands to control operations performed on the memory array synchronized to the system clock input signal.

37. An electronic system, comprising:
a processor; and
a memory device coupled to the processor, wherein the memory device comprises:
a memory array arranged in addressable banks of rows and columns;
at least one address input for receiving at least one bank address input signal of an externally-applied bank address;
at least one buffer, wherein each buffer is coupled to one of the at least one address inputs in a one-to-one relationship;

an address decoder having at least one input and at least two outputs, wherein each input of the address decoder is coupled to one of the at least one buffers in a one-to-one relationship;

at least two latches, wherein each latch is coupled to one of the outputs of the address decoder in a one-to-one relationship through a selective coupling device; and a command execution logic coupled to the memory array for receiving at least a system clock input signal and for generating commands to control operations performed on the memory array, wherein the commands are synchronized to the system clock.

38. A synchronous flash memory assembly, comprising:

a memory package having a plurality of interconnects; and a synchronous flash memory device contained in the memory package, wherein the synchronous flash memory device comprises:

an array of non-volatile flash memory cells arranged in addressable banks of rows and columns;

at least one first address input to receive at least one externally-applied bank address input signal, wherein each first address input is coupled between the processor and the array of non-volatile flash memory cells;

at least one second address input to receive at least one externally-applied remaining address signal, wherein each second address input is coupled between the processor and the array of nonvolatile flash memory cells;

a bank address decode circuitry coupled to receive each bank address input signal and provide at least two decoded bank address output signals;

latch circuitry coupled to the bank address decode circuitry to latch the decoded bank address output signals;

address inputs coupled between the array of non-volatile flash memory cells and a first portion of the plurality of interconnects of the memory package;

data inputs/outputs coupled between the array of non-volatile flash memory cells and a second portion of the plurality of interconnects of the memory package;

power inputs coupled between the array of non-volatile flash memory cells and a third portion of the plurality of interconnects of the memory package;

clock and control signal inputs coupled between the array of non-volatile flash memory cells and a fourth portion of the plurality of interconnects of the memory package; and a command execution logic coupled to the array of non-volatile flash memory cells for receiving at least a system clock input signal from the clock and control signal inputs and for generating commands to control operations performed on the array of non-volatile flash memory cells synchronized to the system clock input signal.

39. An electronic system, comprising:

a processor; and a synchronous flash memory device coupled to the processor, wherein the synchronous flash memory device comprises:

an array of non-volatile flash memory cells arranged in addressable banks of rows and columns;

at least one first address input to receive at least one externally-applied bank address input signal, wherein each first address input is coupled between the processor and the array of non-volatile flash memory cells;

at least one second address input to receive at least one externally-applied remaining address signal, wherein each second address input is coupled between the processor and the array of non-volatile flash memory cells;

a bank address decode circuitry coupled to receive each bank address input signal and provide at least two decoded bank address output signals;

latch circuitry coupled to the bank address decode circuitry to latch the decoded bank address output signals; and a command execution logic coupled to the array of non-volatile flash memory cells for receiving at least a system clock input signal and for generating commands to control operations performed on the array of non-volatile flash memory cells, wherein the commands are synchronized to the system clock.

40. A memory device address input buffer stage, comprising:

at least one address input for receiving at least one address input signal of an externally-applied address;

at least one buffer, wherein each buffer is coupled to one of the at least one address inputs in a one-to-one relationship;

an address decoder having at least one input and at least two outputs, wherein each input of the address decoder is coupled to one of the at least one buffers in a one-to-one relationship and wherein there is no delay stage interposed between an input of the address decoder and its associated buffer; and at least two latches, wherein each latch is coupled to one of the outputs of the address decoder in a one-to-one relationship through a selective coupling device.

* * * * *

UNITED STATES PATENT AND TRADEMARK OFFICE
CERTIFICATE OF CORRECTION

PATENT NO. : 6,366,524 B1
DATED : April 2, 2002
INVENTOR(S) : Ebrahim Abedifard

It is certified that error appears in the above-identified patent and that said Letters Patent is hereby corrected as shown below:

Column 14,
Line 9, replace "address is inputs" with -- address inputs --.

Signed and Sealed this

Sixth Day of May, 2003

JAMES E. ROGAN
*Director of the United States Patent and Trademark Office*